(12) United States Patent
Ryo et al.

(10) Patent No.: US 9,856,582 B2
(45) Date of Patent: Jan. 2, 2018

(54) SIC SINGLE CRYSTAL AND PRODUCTION METHOD THEREOF

(75) Inventors: Mina Ryo, Tokyo (JP); Yoshiyuki Yonezawa, Matsumoto (JP); Takeshi Suzuki, Zushi (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 13/428,395

(22) Filed: Mar. 23, 2012

(65) Prior Publication Data

US 2012/0237428 A1    Sep. 20, 2012

Related U.S. Application Data

(63) Continuation of application No. PCT/JP2010/065913, filed on Sep. 15, 2010.

(30) Foreign Application Priority Data

Sep. 29, 2009  (JP) .................................. 2009-224291

(51) Int. Cl.
C30B 17/00  (2006.01)
C30B 29/36  (2006.01)
C30B 9/10  (2006.01)

(52) U.S. Cl.
CPC ............... *C30B 29/36* (2013.01); *C30B 9/10* (2013.01); *C30B 17/00* (2013.01)

(58) Field of Classification Search
None
See application file for complete search history.

(56) References Cited

U.S. PATENT DOCUMENTS

2005/0183657 A1  8/2005 Kusunoki et al.
2010/0288187 A1  11/2010 Terashima et al.

FOREIGN PATENT DOCUMENTS

| EP | 1498518 A1 | 1/2005 |
| EP | 1806437 A1 | 7/2007 |
| EP | 1895031 A1 | 3/2008 |
| JP | 2000-264790 A | 9/2000 |
| JP | 2002-356397 A | 12/2002 |
| JP | 2004-002173 A | 1/2004 |
| JP | 2007-076986 A | 3/2007 |

(Continued)

OTHER PUBLICATIONS

Translation JP 2002-356397.*

(Continued)

*Primary Examiner* — Guinever S Gregorio
(74) *Attorney, Agent, or Firm* — Rossi, Kimms & McDowell LLP

(57) ABSTRACT

A method is disclosed with provides stable growth of SiC single crystals, particularly 4H—SiC single crystals, with an effective crystal growth rate for a prolonged time even at a low temperature range of 2000° C. or lower. A raw material containing Si, Ti and Ni is charged into a crucible made of graphite and heat-melted to obtain a solvent. At the same time, C is dissolved out from the crucible into the solvent to obtain a melt. A SiC seed crystal substrate is then brought into contact with the melt such that SiC is supersaturated in the melt in the vicinity of the surface of the SiC seed crystal substrate, thereby allowing growth and production of an SiC single crystal on the SiC seed crystal substrate.

18 Claims, 1 Drawing Sheet

(56) References Cited

FOREIGN PATENT DOCUMENTS

| JP | 2007-261843 A | 10/2007 |
|----|---------------|---------|
| JP | 2009-091222 A | 4/2009 |
| JP | 2009-167045 A | 7/2009 |
| JP | 2009-274894 A | 11/2009 |
| JP | 2010-184849 A | 8/2010 |
| WO | 2009-090536 A1 | 7/2009 |

OTHER PUBLICATIONS

International Search Report dated Nov. 2, 2010 for parent PCT/JP2010/065913.
Yakimova, R. et al., "Growth of 4H—SiC from liquid phase", Materials Science and Engineering B, Elsevier Sequoia, Lausanne, Ch, vol. 46, No. 1-3, Apr. 1, 1997, pp. 329-332, XP004085338.
Extended European Search Report issued in European counterpart application No. EP10820359.7, dated Mar. 14, 2013.

* cited by examiner

SIC SINGLE CRYSTAL AND PRODUCTION METHOD THEREOF

This application is a continuation of PCT/JP2010/65913, filed on Sep. 15, 2010, which is based on and claims priority to Japanese Patent Application 2009-224291, filed on Sep. 29, 2009. The disclosure of the Japanese priority application and the PCT application in their entirety, including the drawings, claims, and the specification thereof, are incorporated herein by reference.

BACKGROUND OF THE INVENTION

A. Field of the Invention

The present invention relates to SiC single crystals and production method thereof and more specifically, relates to SiC single crystals for preparing power device substrates by solution growth and to production method thereof.

B. Description of the Related Art

SiC has attracted attention as a material for power devices which have performance limits beyond that of Si power devices because SiC has a bandgap that is about three times higher than Si, a dielectric breakdown voltage that is about seven times higher than Si, and thermal conductivity that is about three times higher than Si. SiC is an ionic covalent crystal and crystallographically includes polytypes with single composition and various stacked structures relative to the c-axis direction. There are polytypes such as 4H (hexagonal crystal system having four molecules in one cycle), 6H (hexagonal crystal system having six molecules in one cycle), 3C (cubic system having three molecules in one cycle), and 15R (rhombohedron system having 15 molecules on in one cycle).

Different polytypes of SiC have different appearance ratio and different thermal physical properties such as thermal stability, bandgap, mobility and impurity level. Uniform single crystal substrates in which only one polytype exists are required in order to apply SiC for optical and electronic devices. In particular, 4H—SiC having a large bandgap is required for power devices.

Growth methods of SiC single crystals have been known such as sublimation, CVD and solution growth methods. The most frequently used method for production of SiC single crystals is sublimation because the liquid phase does not exist at ordinary pressure. In sublimation, highly pure SiC powder is heated at 2200° C. to 2500° C. and the sublimed raw material is fed to the surface of a seed crystal which has been brought to a temperature lower than the powder, thereby allowing re-crystallization. Because various chemical species composed of Si and C are mixed in the sublimed gas and complex reactions occur, polymorphic transition easily occurs and lattice defects such as dislocation are produced. As dislocation causes leaks when PN diodes are produced, it is desired to reduce dislocation density (EPD).

In the CVD method, a single crystal seed crystal substrate is simultaneously fed with diluted carbohydrate gas and silane gas and SiC single crystals are grown epitaxially at the substrate surface by chemical reaction. In CVD method, balanced etching and deposition promote growth. Therefore, the growth rate is slow and it is not suitable for the production of bulk single crystals, and this method is mainly used as an epitaxial growth method of drift layers.

In solution growth, a melt containing Si and C is brought into contact with seed crystals having a lower temperature than that of the melt so as to allow supersaturation of SiC in the melt, thereby allowing growth of SiC single crystals on the surface of seed crystals. In the solution growth method, single crystals having high quality can be obtained because they have less lattice defects and less crystal polymorphism compared to other growth methods. However, at a practical temperature of 2000° C. or lower, solubility of C in a Si melt is extremely low, causing a lower growth rate.

Japanese Patent Application Laid-open No. 2004-002173 discloses a solution growth method in which a single crystal is grown on a seed crystal substrate from a melt of an alloy comprising Si, C and M (wherein M is either Mn or Ti), wherein an atomic ratio between Si and M is Si1-xMx wherein $0.1 \le x \le 0.7$ when M is Mn and $0.1 \le x \le 0.25$ when M is Ti.

Japanese Patent Application Laid-open No. 2007-261843 discloses a method of SiC single crystal growth on a SiC seed crystal substrate by contacting the seed crystal substrate with a melt comprising Si, C, V and Ti wherein an atomic ratio between Si and V represented by [V]/([Si]+[V]) satisfies the relation $0.1 \le [V]/([Si]+[V]) \le 0.45$ and an atomic ratio between Si and Ti represented by [Ti]/[Si]+[Ti]) satisfies the relation $0.1 \le [Ti]/[Si]+[Ti]) \le 0.25$, and supercooling the melt in the vicinity of the seed crystal substrate to allow supersaturation of SiC in the melt.

Japanese Patent Application Laid-open No. 2007-076986 discloses a method of SiC single crystal growth on a seed crystal substrate for SiC growth by contacting the seed crystal substrate with a melt comprising Si, Ti, M (M: any one of Co, Mn and Al) and C, wherein an atomic ratio between Si, Ti and M is SixTiyMz wherein $0.17 \le y/x \le 0.33$ and $0.90 \le (y+z)/x \le 1.80$ when M is Co or Mn and $0.17 \le y/x \le 0.33$ and $0.33 \le (y+z)/x \le 0.60$ when M is Al, and supercooling the melt in the vicinity of the seed crystal substrate to allow supersaturation of SiC in the melt.

According to the method disclosed in Japanese Patent Application Laid-open No. 2004-002173 in which Mn or Ti is added, the C concentration in the melt at 2000° C. or lower can be increased compared to Si—C dual systems so that the crystal growth rate can be increased. Especially, addition of Ti allows the production of SiC single crystals having high quality with a few times higher growth rate than the conventional liquid phase growth from Si—C dual system melts. However, although addition of Ti allows stable growth with respect to the growth of 6H—SiC single crystals, 6H—SiC polytype is mixed during the growth of 4H—SiC single crystals which are promising for power device applications, so that stable growth cannot be obtained. In addition, the C concentration in the melt is significantly increased by addition of Mn; however, stable growth cannot be obtained for a prolonged time because the vapor pressure of Mn is low.

According to the methods disclosed in Japanese Patent Application Laid-open No. 2007-261843 and Japanese Patent Application Laid-open No. 2007-076986, the Si—Ti—C triple system is further added with V, Co, Mn or Al to increase the C concentration of the melt and liquid phase growth is carried out by using the melt having a higher C concentration. However, neither method provides the crystal growth rate comparable to that of sublimation regarding the growth of 4H—SiC single crystals.

The present invention is directed to overcoming or at least reducing the effects of one or more of the problems set forth above.

SUMMARY OF THE INVENTION

With the foregoing in view, it is an object of the present invention to provide a method which can stably produce 4H—SiC single crystals with an effective crystal growth rate for a prolonged time even at a low temperature range of 2000° C. or lower, and a 4H—SiC single crystal obtained thereby.

In order to solve the above problem, the method for production of a SiC single crystal according to the present invention includes dissolving C in a solvent in which a raw material containing Si, Ti and Ni has been heat-melted, thereby preparing a melt, and bringing a SiC seed crystal into contact with the melt such that SiC is supersaturated in the melt in the vicinity of the surface of the SiC seed crystal, to thereby allow growth of the SiC single crystal on the SiC seed crystal.

An atomic ratio of Ti relative to Si preferably satisfies the relation $0.05 \leq [Ti]/([Si]+[Ti]) \leq 0.3$, and an atomic ratio of a total of Ti and Ni relative to Si preferably satisfies the relation $0.1 \leq ([Ti]+[Ni])/([Si]+[Ti]+[Ni]) \leq 0.65$. The method for production of a SiC single crystal of the present invention is preferably carried out at atmospheric pressure or under pressure. According to another mode, the present invention is a SiC single crystal produced according to the above-mentioned method.

According to the present invention, Ti and Ni are added to the melt to increase solubility of C to the melt at a low temperature range of 2000° C. or lower, thereby maintaining high C concentration in the melt as well as suppressing mixing of the polytype of 6H—SiC. Accordingly, 4H—SiC single crystals can be stably produced with an effective crystal growth rate for a prolonged time.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

An embodiment of the method for production of a SiC single crystal according to the present invention is hereinafter described with referring to the attached figures. The description of the embodiment is to assist understanding of the present invention and does not intend to limit the scope of the present invention.

Figure 1:
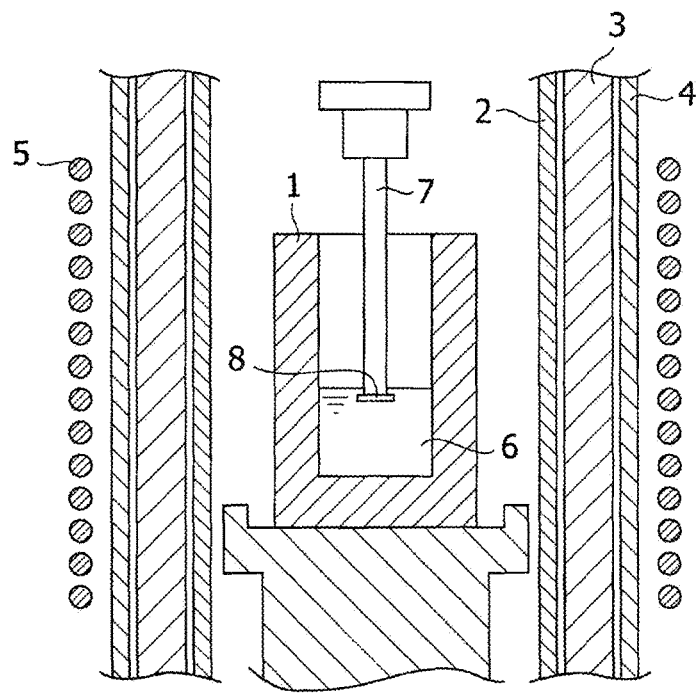
FIG. 1 is a sectional view schematically showing a SiC single crystal growth apparatus used in the present invention.

As shown in FIG. 1, a SiC single crystal production apparatus comprises crucible 1 made of graphite at a center of the apparatus and furnace tube 2, silica tube 3 and heat insulator 4 in this order surround the outside of crucible 1. The inside of furnace tube 2 may be atmospheric pressure or under pressure. High frequency coils 5 are arranged at the outside of the heat insulator 4. The crucible 1 has an opening at the top and water-cooled dip shaft 7 is arranged such that it is movable in the vertical direction in crucible 1 through the opening. Seed crystal substrate 8 is provided at the lower end of dip shaft 7. Seed crystal substrate 8 is made of a SiC single crystal having the same crystal structure as the SiC single crystal to be produced. Melt 6 is retained in crucible 1.

In order to prepare the melt 6, a raw material containing Si, Ti and Ni is first charged into crucible 1. The raw material may be in the form of powder, granules or bulk. It is preferable that an atomic ratio of Ti relative to Si satisfies the relation $0.05 \leq [Ti]/([Si]+[Ti]) \leq 0.3$. An atomic ratio of the total of Ti and Ni relative to Si preferably satisfies the relation $0.1 \leq ([Ti]+[Ni])/([Si]+[Ti]+[Ni]) \leq 0.65$. According to the present invention in which Cr or Ni is added to the Si—Ti—C triple system, the C concentration in the melt at a low temperature range of 2000° C. or lower can be increased and SiC single crystals, particularly 4H—SiC single crystals can be stably grown with an increased crystal growth rate. The above ranges of the atomic ratios of the raw material ensure stable growth of SiC single crystals with the increased crystal growth rate. The atomic ratio range of Ti relative to Si is more preferably $0.1 \leq [Ti]/([Si]+[Ti]) \leq 0.3$. The atomic ratio range of the total of Ti and Ni relative to Si is more preferably $0.105 \leq ([Ti]+[Ni])/([Si]+[Ti]+[Ni]) \leq 0.45$, still more preferably $0.35 \leq ([Ti]+[Ni])/([Si]+[Ti]+[Ni]) \leq 0.45$.

The atomic ratio of Ni relative to Ti preferably satisfies the relation $0.05 \leq [Ni]/([Ti]+[Ni]) \leq 0.70$. The effect of addition of two elements of Ti and Ni can be satisfactorily exerted due to the atomic ratio of X in this range. The atomic ratio of Ni relative to Ti is more preferably $0.05 \leq [Ni]/([Ti]+[Ni]) \leq 0.54$, and still more preferably $0.15 \leq [Ni]/([Ti]+[Ni]) \leq 0.54$.

The raw material charged into crucible 1 is totally melted by induction-heating with high frequency coils 5. In the present specification, this molten raw material is referred to as the solvent. Next, C is dissolved in the solvent to prepare melt 6 containing Si, C, Ti and Ni. C may be dissolved by any method without limitation, and a method in which C is dissolved out from graphite crucible 1, a method in which gas containing C is fed into the crucible 1 from the opening of crucible 1 and C is dissolved in the solvent by gas-liquid interface reaction or combination of these methods are preferable.

When C is dissolved out from the crucible, a crucible made of graphite without any impurities is preferable in order to prevent dissolution of impurities other than C to the solvent. When gas containing C is fed, the gas containing C may be carbohydrate gas, or carbohydrate gas diluted with hydrogen.

The gas containing C may be fed together with gas containing Si. Si source is preferably silane, disilane, chlorosilane (represented by $SiH_nCl_{4-n}$, wherein n is 1, 2 or 3). With the growth of SiC single crystals, Si in melt 6 together with C is consumed; thus composition of melt 6 may be maintained by feeding gas containing Si and dissolve Si into melt 6.

Solubility of C in melt 6 is increased when the temperature of melt 6 is increased. According to the present invention, solubility of C in melt 6, and thus the C concentration in melt 6 can be further increased at a low temperature range of 2000° C. or lower, due to further addition of Ni as well as Ti to melt 6. The temperature of melt 6 which can maintain such high C concentration is preferably at least 1000° C., more preferably 1200° C. or higher and still more preferably 1500° C. or higher. The temperature of melt 6 may be over 2000° C. without any technical problems. However, it is preferably 2000° C. or lower, more preferably 1700° C. or lower and still more preferably 1650° C. or lower in view of energy efficiency.

After melt 6 is prepared as above, dip shaft 7 attached with seed crystal substrate 8 at its lower end is lowered so that seed crystal substrate 8 is soaked in melt 6. Cooling water (not shown) is then provided in dip shaft 7 to cool seed crystal substrate 8. Due to this, a temperature gradient is produced with the melt 6 at the side of the seed crystal substrate 8 having a lower temperature. The temperature gradient ΔT is preferably 40° C./cm. SiC is supersaturated in the vicinity of the surface of seed crystal substrate 8, and a SiC single crystal is deposited at the surface of seed crystal substrate 8. In order to obtain uniform crystal growth, dip shaft 7 and/or crucible 1 are/is preferably rotated during crystal growth. The SiC crystal to be grown according to the present invention is not specifically limited. However, among other SiC single crystals, 4H—SiC single crystal can be stably grown with rapid crystal growth rate due to addition of Ti and Ni to melt 6.

EXAMPLES

A SiC single crystal growth test was carried out with a SiC single crystal growth apparatus shown in FIG. 1. First, a raw material having composition of $Ti_{0.15}Ni_{0.15}Si_{0.7}$ was charged into a crucible made of graphite and the crucible was heated to 1600° C. in an Ar atmosphere with the pressure of 1 atm. The raw material was totally melted and C was dissolved out from the inner wall of the crucible to obtain a melt containing Si, C, Ti and Ni.

At the lower end of the water-cooled dip shaft, a 4H—SiC seed crystal substrate of 10 mm×10 mm×0.35 mm thickness was fixed and the dip shaft was lowered so that the lower end thereof was soaked in the melt in the crucible. While the seed crystal substrate was brought into contact with the melt, the SiC single crystal growth apparatus was again adjusted to an Ar atmosphere with 1 atm before the dip shaft was water-cooled by rotating the crucible and the dip shaft in the opposite directions at a speed of 5 rpm for crystal growth for 10 hours (Example 1).

As a result, a 4H—SiC bulk single crystal having a film thickness of about 1 mm could be obtained. The obtained crystal was sectioned and the surface was optically polished before subjecting the crystal for etching in a molten KOH solution at 500° C. for observation of etch pit under an optical microscope. It was then found that the SiC single crystal obtained had high quality with an etch pit density (EPD) of about $5000/cm^2$.

SiC single crystals were grown in the similar manner as above except that composition of the raw material and the growth period were varied. The altered composition of the raw material, growth period and the film thickness of the obtained SiC single crystals are shown in Table 1.

TABLE 1

| | Composition of raw material (at %) | | | Growth period | Film thickness |
|---|---|---|---|---|---|
| | Si | Ti | Ni | (hour) | (mm) |
| Example 1 | 70 | 15 | 15 | 10 | 1 |
| Example 2 | 70 | 15 | 15 | 1 | 0.092 |
| Example 3 | 60 | 20 | 20 | 5 | 0.2 |

Figure 2:
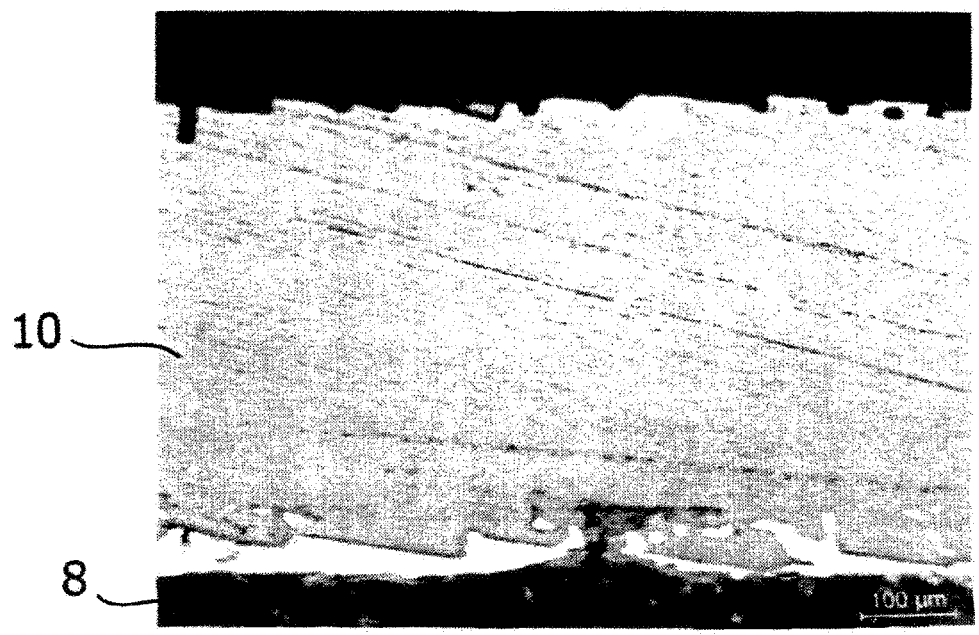
FIG. 2 is an optical microscopic image showing a section of a SiC single crystal obtained in the example.

As can be seen from Table 1, the crystal having the film thickness of about 92 μm was obtained with the growth period of an hour in Example 2 in which the raw material having the same composition as Example 1 was used. Thus, it was confirmed that the SiC single crystal was stably grown for a prolonged time with the crystal growth rate of about 100 μm/hr. FIG. 2 shows an optical microscopic image of the section of the crystal obtained in Example 2. As can be seen from FIG. 2, a SiC single crystal layer 10 was grown on the seed crystal substrate 8. When the ratio of the total of Ti and Ni was increased in Example 3, the crystal growth rate was decreased compared to Example 1. Thus, it was confirmed that it is preferable to keep the composition ratio of Si being constant.

Thus, a SiC single crystal and production method thereof have been described according to the present invention. Many modifications and variations may be made to the techniques and structures described and illustrated herein without departing from the spirit and scope of the invention. Accordingly, it should be understood that the products and methods described herein are illustrative only and are not limiting upon the scope of the invention.

EXPLANATION OF REFERENCE NUMERALS

1 Crucible
2 Furnace tube
3 Silica tube
4 Heat insulator
5 High frequency coils
6 Melt
7 Dip shaft
8 Seed crystal substrate
10 Crystal growth layer

What is claimed is:

1. A method for production of a SiC single crystal, comprising:
   dissolving C in a solvent in which a raw material containing Si, Ti and Ni has been heat-melted, thereby preparing a melt; and
   bringing a SiC seed crystal into contact with the melt such that SiC is supersaturated in the melt in the vicinity of the surface of the SiC seed crystal, to thereby allow growth of the SiC single crystal on the SiC seed crystal, wherein an atomic ratio of Ti relative to Si satisfies the relation $0.05 \leq [Ti]/([Si]+[Ti]) \leq 0.3$, and
   wherein an atomic ratio of a total of Ti and Ni relative to Si satisfies the relation $0.1 \leq ([Ti]+[Ni])/([Si]+[Ti]+[Ni]) \leq 0.45$.

2. The method according to claim 1, wherein an atomic ratio of Ti relative to Si satisfies the relation $0.1 \leq [Ti]/([Si]+[Ti]) \leq 0.3$.

3. The method according to claim 1, wherein an atomic ratio of Ni relative to Ti satisfies the relation $0.05 \leq [Ni]/[([Ti]+[Ni]) \leq 0.70$.

4. The method according to claim 1, wherein an atomic ratio of Ni relative to Ti satisfies the relation $0.05 \leq [Ni]/[([Ti]+[Ni]) \leq 0.54$.

5. The method according to claim 1, wherein an atomic ratio of Ni relative to Ti satisfies the relation $0.05 \leq [Ni]/[([Ti]+[Ni]) \leq 0.70$.

6. The method according to claim 1, wherein an atomic ratio of Ni relative to Ti satisfies the relation $0.05 \leq [Ni]/[([Ti]+[Ni]) \leq 0.54$.

7. The method according to claim 1, which is carried out at atmospheric pressure or under pressure.

8. The method according to claim 1, wherein the raw material is charged into a crucible.

9. The method according to claim 8 wherein the crucible is made of impurity-free graphite.

10. The method according to claim 8, wherein a gas containing C is fed into the crucible and is dissolved in the solvent by gas-liquid interface reaction.

11. The method according to claim 10, wherein the gas containing C is a carbohydrate gas or a carbohydrate gas diluted with hydrogen.

12. The method according to claim 10, wherein the gas containing C is fed together with a gas containing Si.

13. The method according to claim 12, wherein the gas continuing Si is silane, disilane, or $SiH_nCl_{4-n}$, wherein n is 1, 2 or 3.

14. The method according to claim 12, wherein composition of the melt is maintained by feeding the gas containing Si.

15. The method according to claim 1, wherein temperature of the melt is 2000° C. or lower.

16. The method according to claim 15, wherein the seed crystal is cooled such that the melt at the side of the seed crystal has a lower temperature, wherein a temperature gradient ΔT is about 40° C./cm.

17. The method according to claim 16, wherein SiC is supersaturated in the vicinity of the surface of seed crystal.

18. The method according to claim 1, wherein temperature of the melt is 1700° C. or lower.

\* \* \* \* \*